(12) United States Patent
Bourgeois

(10) Patent No.: US 9,933,488 B2
(45) Date of Patent: Apr. 3, 2018

(54) OPEN CIRCUIT VOLTAGE CHECKING FOR A BATTERY SYSTEM

(75) Inventor: Richard Bourgeois, Albany, NY (US)

(73) Assignee: General Electric Company, Schenectady, NY (US)

( * ) Notice: Subject to any disclaimer, the term of this patent is extended or adjusted under 35 U.S.C. 154(b) by 1133 days.

(21) Appl. No.: 13/556,525

(22) Filed: Jul. 24, 2012

(65) Prior Publication Data

US 2014/0028321 A1 Jan. 30, 2014

(51) Int. Cl.
G01N 27/416 (2006.01)
H02J 7/00 (2006.01)
G01R 31/36 (2006.01)

(52) U.S. Cl.
CPC ........ G01R 31/362 (2013.01); *G01R 31/3658* (2013.01); *G01R 31/3679* (2013.01)

(58) Field of Classification Search
CPC .. H01M 10/42; H01M 10/4207; H01M 10/44; H01M 10/441; H01M 10/446; H01M 10/448; H02J 7/0013; H02J 7/0024; H02J 7/0031; H02J 7/0032; H02J 7/0057; H02J 7/0063; H02J 7/065; H02J 7/0068
USPC .......................................... 320/126; 324/427
See application file for complete search history.

(56) References Cited

U.S. PATENT DOCUMENTS

2007/0120536 A1* 5/2007 Runkle ............... H01M 10/441
320/136
2007/0170893 A1 7/2007 Kao et al.
2010/0123352 A1* 5/2010 Elleman ................ H02J 7/0063
307/66
2010/0321025 A1* 12/2010 Lin ..................... H01M 10/441
324/427
2012/0274331 A1* 11/2012 Liu ..................... G01R 31/362
324/426
2013/0144547 A1 6/2013 Yun et al.

OTHER PUBLICATIONS

Search Report and Written Opinion from corresponding PCT Application No. PCT/US2013/048500 dated Oct. 7, 2013.
Hsu, Chung-Ti et al., "Increased energy delivery for parallel battery packs with no regulated bus", Telecommunications Energy Conference (INTELEC), 2012 IEEE 34th International, IEEE, pp. 1-8, Sep. 30, 2012.

* cited by examiner

*Primary Examiner* — Drew A Dunn
*Assistant Examiner* — Michael Dibenedetto
(74) *Attorney, Agent, or Firm* — Dority & Manning, P.A.

(57) ABSTRACT

Systems and methods for managing open circuit voltage checks of energy storage modules in an energy storage system. Embodiments of the present invention provide a controller of an energy storage system configured to schedule open circuit voltage checks for the energy storage modules, determine if conditions of an energy storage module, and of the overall energy storage system, are favorable for performing an open circuit voltage check, and defer an open circuit voltage check if at least one condition is not favorable. The controller is further configured to abandon an open circuit voltage check in progress if one or more conditions of the overall energy storage system changes in a manner that is unfavorable for continuing with the open circuit voltage check.

28 Claims, 2 Drawing Sheets

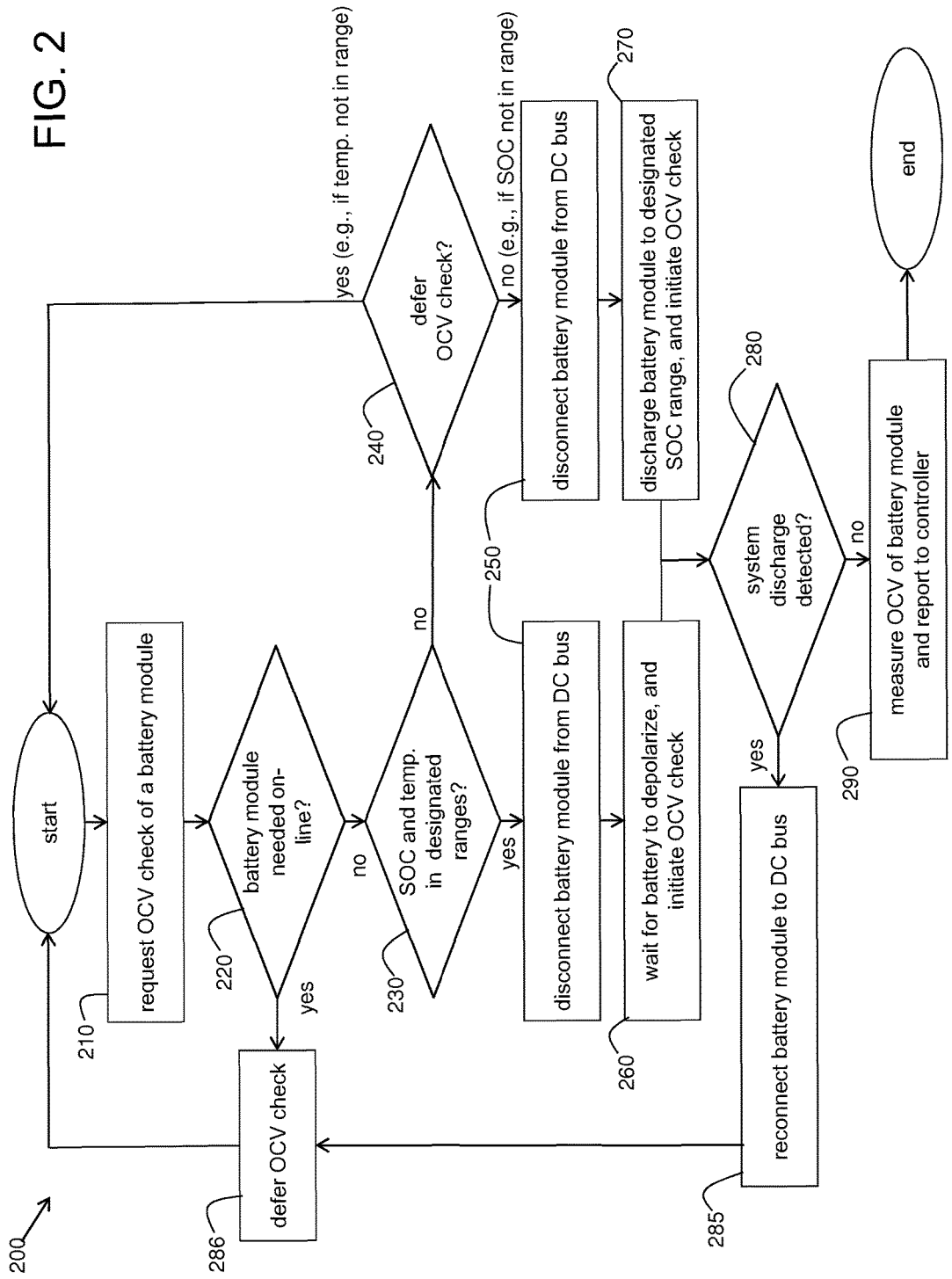

OPEN CIRCUIT VOLTAGE CHECKING FOR A BATTERY SYSTEM

BACKGROUND

Technical Field

The subject matter disclosed herein relates to methods and systems for managing open circuit voltage checks of energy storage modules in an energy storage system.

Discussion of Art

In certain battery systems, it may not be practical to sense voltage from every cell in a battery. Therefore, open circuit voltage (OCV) measurements are often a primary means of determining battery health and detecting the presence of cells that have failed to an electrical short. An OCV check may be manually performed by a technician on a battery module (energy storage module) to determine a number of cells in the battery module, if any, that have failed or are degraded. In energy storage systems having many battery modules, such as in an uninterruptable power supply (UPS) system for a telecommunications site or a server farm, for example, the ability to schedule and perform OCV checks on the battery modules may be limited. For example, manually checking OCV during system operation can be problematic since a battery module may need to be disconnected from a DC bus and discharged below a certain state-of-charge level before performing the OCV check. Battery modules used as backup typically spend almost all of their time connected to the system in a fully charged state. Therefore, system performance or availability can be compromised when performing an OCV check.

Brief Description

Systems and methods for managing open circuit voltage checks of energy storage modules in an energy storage system are disclosed. Embodiments of the present invention provide a controller of an energy storage system configured to schedule open circuit voltage checks for the energy storage modules, determine if conditions of an energy storage module, and of the overall energy storage system, are favorable for performing an open circuit voltage check, and defer an open circuit voltage check if at least one condition is not favorable. The controller is further configured to abandon an open circuit voltage check in progress if one or more conditions of the overall energy storage system changes in a manner that is unfavorable for continuing with the open circuit voltage check.

In one embodiment, a method is provided. The method includes deferring an open circuit voltage check of a battery module in a battery system when the battery module is in operational service or when the battery module is scheduled to be in operational service during a designated period for the open circuit voltage check. The method further includes initiating the open circuit voltage check and monitoring for a battery system discharge during the open circuit voltage check. The method also includes reconnecting the battery module to a direct current (DC) bus of the battery system and deferring the open circuit voltage check when the battery system discharges during the open circuit voltage check. The method may include determining if a state-of-charge of the battery module is within a designated state-of-charge range for performing the open circuit voltage check, and when the state-of-charge is not within the designated state-of-charge range, disconnecting the battery module from the DC bus and discharging the battery module to the designated state-of-charge range. The method may include determining if a state-of-charge of the battery module is within a designated state-of-charge range for performing the open circuit voltage check, and when the state-of-charge is within the designated state-of-charge range, disconnecting the battery module from the DC bus and waiting for the battery module to depolarize. The method may include determining if a state-of-charge and a temperature of the battery module are respectively within a designated state-of-charge range and a designated temperature range for performing the open circuit voltage check, and when the state-of-charge is not within the designated state-of-charge range and the temperature is within the designated temperature range, disconnecting the battery module from the DC bus and discharging the battery module to the designated state-of-charge range. The method may include determining if a state-of-charge and a temperature of the battery module are respectively within a designated state-of-charge range and a designated temperature range for performing the open circuit voltage check, and deferring the open circuit voltage check to a later time when the temperature is not within the designated temperature range. The method may include determining if a state-of-charge and a temperature of the battery module are respectively within a designated state-of-charge range and a designated temperature range for performing the open circuit voltage check, and when the state-of-charge is within the designated state-of-charge range and when the temperature is within the designated temperature range, disconnecting the battery module from the DC bus and waiting for the battery module to depolarize. The method may include measuring an open circuit voltage of the battery module, and reporting a value of the open circuit voltage to a controller of the battery system. The method may include determining that one or more cells within the battery module have failed or are degraded, based on the reported open circuit voltage value, and scheduling the battery module for maintenance.

In one embodiment, a battery system is provided. The battery system includes a plurality of energy storage modules operably couplable/decouplable to a direct current (DC) bus, wherein the energy storage modules include respective module management systems, and a controller, in communication with the module management systems, that is operable to selectively initiate coupling/decoupling of the energy storage modules to the DC bus, and to schedule an open circuit voltage check of at least one energy storage module of the plurality of energy storage modules, determine if the at least one energy storage module is to be coupled to the DC bus, and defer the open circuit voltage check to a later time when the at least one energy storage module is to be coupled to the DC bus. The controller may be further operable to determine if a system discharge is detected during the open circuit voltage check of the at least one energy storage module, and couple the at least one energy storage module to the DC bus of the battery system when the system discharge is detected during the open circuit voltage check and defer the open circuit voltage check to a later time. The controller may be further operable to determine if a state-of-charge of the at least one energy storage module is within a designated state-of-charge range for performing the open circuit voltage check, and when the state-of-charge is not within the designated state-of-charge range, command that the at least one energy storage module be decoupled from the DC bus and discharged to the designated state-of-charge range. The controller may be operable to determine if a state-of-charge of the at least one energy storage module is within a designated state-of-charge range for performing the open circuit voltage check, and when the state-of-charge is within the designated state-of-charge range, command that the at least one energy storage module be decoupled from the DC bus and depolarized. The controller may be operable to determine if a state-of-charge and a temperature of the at least one energy storage module are respectively within a designated state-of-charge range and a designated temperature range for performing the open circuit voltage check, and when the state-of-charge is not within the designated state-of-charge range and the temperature is within the designated temperature range, command that the at least one energy storage module be decoupled from the DC bus and discharged to the designated state-of-charge range. The controller may be operable to determine if a state-of-charge and a temperature of the at least one energy storage module are respectively within a designated state-of-charge range and a designated temperature range for performing the open circuit voltage check, and defer the open circuit voltage check to a later time when the temperature is not within the designated temperature range. The controller may be operable to determine if a state-of-charge and a temperature of the at least one energy storage module are respectively within a designated state-of-charge range and a designated temperature range for performing the open circuit voltage check, and when the state-of-charge is within the designated state-of-charge range and when the temperature is within the designated temperature range, command that the at least one energy storage module be decoupled from the DC bus and depolarized. At least one of the module management systems of the at least one energy storage module may be operable to measure an open circuit voltage of the at least one energy storage module, and report a value of the open circuit voltage to the controller. The controller may be operable to determine that one or more cells within the at least one energy storage module have failed or are degraded, based on the reported open circuit voltage value, and schedule the at least one energy storage module for maintenance.

In one embodiment, a battery system is provided. The battery system includes means for selectively initiating coupling/decoupling of at least one energy storage module to a direct current bus, means for scheduling an open circuit voltage check of the at least one energy storage module, means for determining if the at least one energy storage module is to be coupled to the direct current bus, and means for deferring the open circuit voltage check to a later time when the at least one energy storage module is to be coupled to the direct current bus. The battery system may further include means for determining if a system discharge is detected during the open circuit voltage check of the at least one energy storage module, and when a system discharge is detected during the open circuit voltage check, means for coupling the at least one energy storage module to the direct current bus and deferring the open circuit voltage check to a later time. In accordance with an embodiment, one or more of the means may be a set of non-transient instructions stored in a machine-readable medium that, when executed by a controller, cause the controller to perform the stated function of the means.

In one embodiment, a battery system is provided. The battery system includes coupler means for selectively initiating coupling/decoupling of at least one energy storage module to a direct current bus, schedule means for scheduling an open circuit voltage check of the at least one energy storage module, determination means for determining if the at least one energy storage module is to be coupled to the direct current bus, and deferral means for deferring the open circuit voltage check to a later time when the at least one energy storage module is to be coupled to the direct current bus. The determination means may include means for determining if a system discharge is detected during the open circuit voltage check of the at least one energy storage module, and the coupler means and the deferral means may include means for coupling the at least one energy storage module to the direct current bus and means for deferring the open circuit voltage check to a later time, respectively, when the system discharge is detected during the open circuit voltage check. In accordance with an embodiment, one or more of the means may be a set of non-transient instructions stored in a machine-readable medium that, when executed by a controller, cause the controller to perform the stated function of the means.

In one embodiment, a method is provided. The method includes disconnecting a battery module of a battery system from a direct current (DC) bus of the battery system, initiating an open circuit voltage check of the battery module and monitoring the DC bus for a battery system discharge during the open circuit voltage check, and reconnecting the battery module to the DC bus of the battery system and deferring the open circuit voltage check when the battery system discharges during the open circuit voltage check.

In one embodiment, a method is provided. The method includes scheduling an open circuit voltage check of a battery module in a battery system, if the battery module is in operational service at a designated time of commencing the open circuit voltage check according to the scheduling, or if the battery module is scheduled to be in operational service during a duration of the open circuit voltage check according to the scheduling, deferring the open circuit voltage check to a first time later than the designated time, subsequent to deferring the open circuit voltage check, initiating the open circuit voltage check at the first time and monitoring for a battery system discharge during the open circuit voltage check, and responsive to the battery system discharge occurring during the open circuit voltage check, reconnecting the battery module to a DC bus of the battery system and further deferring the open circuit voltage check to a second time later than the first time.

BRIEF DESCRIPTION OF THE DRAWINGS

Reference is made to the accompanying drawings in which particular embodiments of the invention are illustrated as described in more detail in the description below, in which:

FIG. 2 illustrates a flow chart of an exemplary embodiment of a method for managing open circuit voltage checks in the energy storage system of FIG. 1.

DETAILED DESCRIPTION

Figure 1:
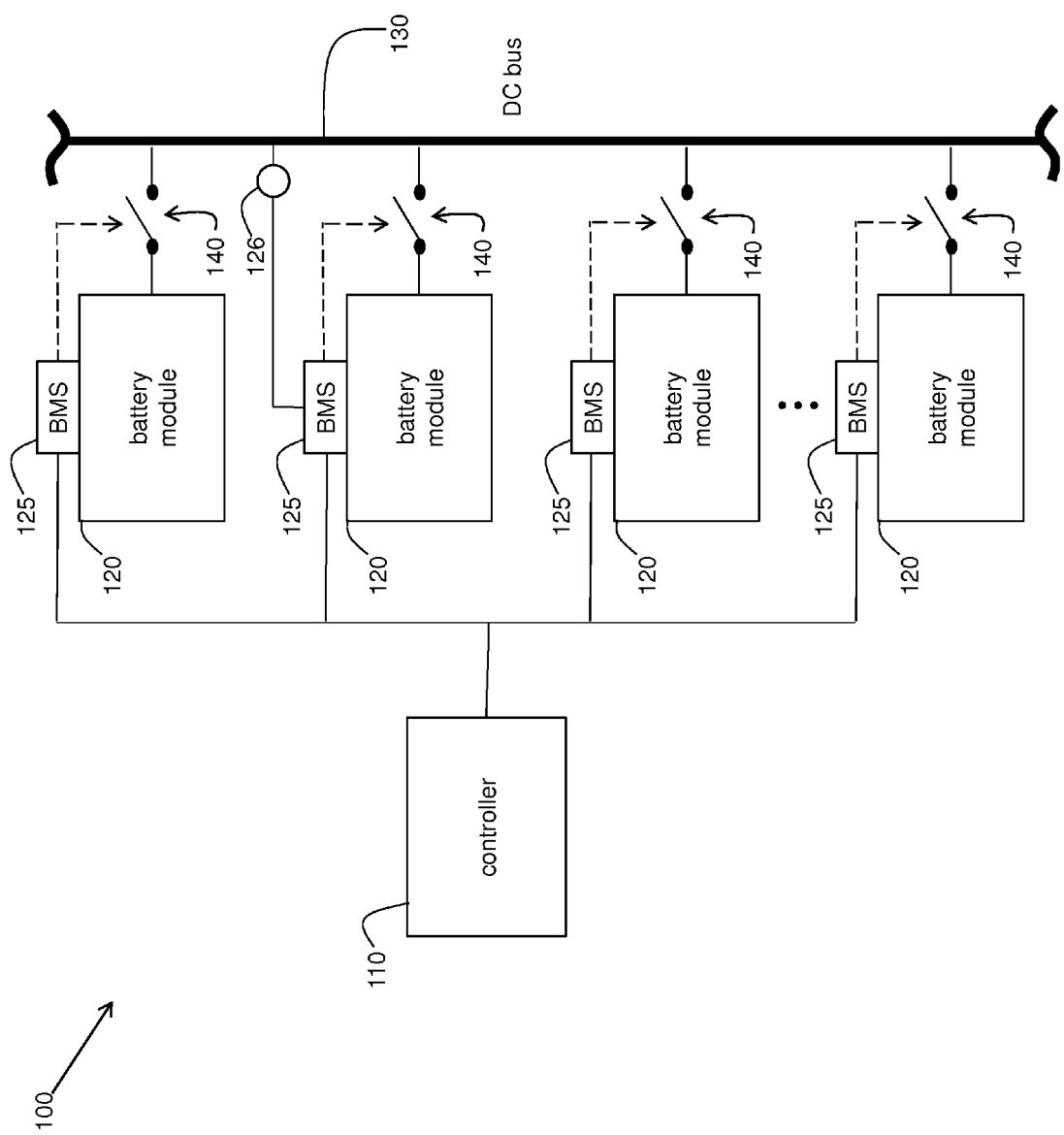
FIG. 1 is a schematic block diagram of an exemplary embodiment of an energy storage system having a controller configured to manage open circuit voltage checks of energy storage modules in the energy storage system.

Embodiments of the present invention relate to methods and systems for managing open circuit voltage checks of multi-cell battery modules in an energy storage system. One embodiment relates to a battery system having a plurality of energy storage modules that are operably couplable/decouplable to a direct current (DC) bus. That is, the energy storage modules are configured to be controlled for selective coupling and decoupling to the DC bus.

With reference to the drawings, like reference numerals designate identical or corresponding parts throughout the several views. However, the inclusion of like elements in different views does not mean a given embodiment necessarily includes such elements or that all embodiments of the invention include such elements.

The terms "battery module" and "energy storage module" are used interchangeably herein and refer to a module having a plurality of chemical cells that provide electrical energy.

"Software" or "computer program" as used herein includes, but is not limited to, one or more computer readable and/or executable instructions that cause a computer or other electronic device to perform functions, actions, and/or behave in a desired manner. The instructions may be embodied in various forms such as routines, algorithms, modules or programs including separate applications or code from dynamically linked libraries. Software may also be implemented in various forms such as a stand-alone program, a function call, a servlet, an applet, an application, instructions stored in a memory, part of an operating system or other type of executable instructions. It will be appreciated by one of ordinary skill in the art that the form of software is dependent on, for example, requirements of a desired application, the environment it runs on, and/or the desires of a designer/programmer or the like.

"Computer" or "processing element" or "computer device" as used herein includes, but is not limited to, any programmed or programmable electronic device that can store, retrieve, and process data. "Non-transitory computer-readable media" include, but are not limited to, a CD-ROM, a removable flash memory card, a hard disk drive, a magnetic tape, and a floppy disk.

"Computer memory", as used herein, refers to a storage device configured to store digital data or information which can be retrieved by a computer or processing element.

"Controller", as used herein, refers to the logic circuitry and/or processing elements and associated software or program involved in controlling an energy storage system.

The terms "signal", "data", and "information" may be used interchangeably herein and may refer to digital or analog forms.

FIG. 1 is a schematic block diagram of an exemplary embodiment of an energy storage system 100 having a controller 110 configured to manage open circuit voltage checks of energy storage modules 120 (battery modules) in the energy storage system 100. Each energy storage module 120 includes a plurality of electro-chemical cells for producing electrical energy. In accordance with an embodiment, each energy storage module 120 includes a string of electro-chemical cells connected in series. Other configurations of cells may be possible as well. Each of the energy storage modules 120 also has a module management system 125 (e.g., a battery management system or BMS) that can sense battery operating parameters and isolate each battery module from the DC bus. The controller 110 is configured to be in communication with each module management system 125 of the energy storage modules 120.

The energy storage system 100 also includes a direct current (DC) bus 130. The energy storage modules 120 may be selectively coupled to or decoupled from the DC bus 130 through battery contactors 140 at the command of the controller 110 via the module management systems 125. When coupled to the DC bus 130, the energy storage modules 120 are electrically in parallel with each other. In accordance with one embodiment, the energy storage system 100 may be used to provide backup electrical power to a main load of the system connected to the DC bus 130 such as, for example, a bank of server computers.

In general, the energy storage system 100 is configured such that a module management system 125 may perform an open circuit voltage (OCV) check on a corresponding energy storage module 120 by measuring the OCV and reporting a value of the OCV to the controller 110. For an OCV check to be performed on an energy storage module 120, the energy storage module 120 is electrically decoupled from the DC bus 130. The energy storage module 120 may need to meet other conditions as well for a proper OCV check to be performed, as is discussed later herein.

The controller 110 may be configured to (e.g., programmed to) calculate a number of "good" cells by dividing the measured OCV value by an expected OCV per cell (e.g., 2.58 volts). If the calculated number of "good" cells is less than the known number of cells actually in the energy storage module 120, then a number of failed or degraded cells can be assumed. In this manner, maintenance or replacement of an energy storage module 120 may be scheduled by the controller 110, for example when failed or degraded cells are determined for that energy storage module 120.

In accordance with an embodiment of the invention, an operator of a system may schedule open circuit voltage (OCV) checks for batteries (battery modules) of a battery system based on a timing of routine maintenance, for example. The scheduling may be, for example, once every six months or once every year for each battery of the system. The operator may schedule each battery individually or the system may schedule the entire battery bank of the system such that each battery module is checked every six months, for example. In general, scheduled OCV checks may be performed, while allowing the system to be available to discharge to a load (i.e., the OCV check of a battery may have to be deferred if the battery is needed online). Furthermore, it may be desirable to check OCV after an event or incident. For example, an event or incident may occur, indicating that a cell has failed somewhere in the battery system. When an OCV check is scheduled or requested for a battery module, if the battery module is not ready for the OCV check, the system may defer the OCV check to a later time. The system continually monitors conditions until parameters are such that an OCV check may proceed. Once a scheduled OCV check is completed, a timer in the system may be reset for a next OCV check, based on a periodic schedule.

In accordance with an embodiment, a battery management system (BMS) is powered by the DC bus. When a battery is to be "disconnected" from the DC bus (e.g., for an OCV check), the BMS associated with the battery disconnects the cells of the battery from the DC bus. The BMS remains "awake" and is continually monitoring parameters such as, for example, state-of-charge (SOC) and temperature of the battery. If an OCV check determines that a battery module has one or more failed cells, the subsequent action taken may depend on the battery module. For example, each battery module may have a defined threshold for the number of failed cells that may be tolerated, allowing the battery to continue to operate. The actions that may be taken when failures are determined may include alerting the operator to the failed cell(s) and/or shutting down the battery module if the number of failed cells exceeds the threshold. Furthermore, if the BMS for a battery module has the capability to selectively disconnect one or more cell strings of the battery module in response to a failure, that action may be taken.

FIG. 2 illustrates a flow chart of an exemplary embodiment of a method 200 for managing open circuit voltage checks in the energy storage system 100 of FIG. 1. In step 210 of the method 200, an OCV check of a battery module (energy storage module) is requested. In accordance with an embodiment, the request may be made by a user via the controller 110 or the request may have been automatically scheduled by the controller 110. In step 220, it is determined whether or not the battery module is presently needed on-line or not (i.e., does the battery module need to remain connected to the DC bus?).

The determination of whether or not the battery module is needed on-line may be determined automatically by the controller 110. For example, if the battery modules 120 are currently discharging (i.e., being used to power a main load of the system), then the controller 110 may determine that the battery module to be checked is needed on-line, and the OCV check may be deferred to a later time in step 286. In general, the controller 110 may be configured to recognize how many battery modules 120 need to be connected to the DC bus 130 to provide backup power for the main load and how many battery modules 120 are available to be connected to the DC bus 130.

If the battery module is not needed on-line then, in step 230, it is determined if the state-of-charge (SOC) and the temperature of the battery module are within their respective designated ranges. A temperature sensor within the battery module may report a temperature value to the BMS which gets reported back to the controller 110, for example. The controller 110 may be made aware of the SOC of the battery module 120 by the BMS 125 of the battery module.

In accordance with an embodiment, the BMS 125 of the battery module 120 "knows" the SOC of the battery module by counting amp-hours in and out of the battery module. 100% SOC is defined as the state when no current is flowing at a certain reference charging voltage. An amp-hour counter in the BMS may be used to determine when the SOC is less than 100%. In accordance with an embodiment, a designated SOC range for measuring the OCV of a battery module may be 20% SOC to 87% SOC. Over such a designated SOC range, the OCV is relatively constant. Outside of such a designated SOC range, the OCV can change significantly with SOC and become meaningless with respect to the objective of the OCV check, which is to determine the presence of failed or degraded cells.

If SOC and/or temperature are not within their designated ranges, then in step 240, the OCV check may be deferred to a later time (e.g., if the temperature is not within the designated temperature range). Temperature may be driven to the designated range via heating and/or cooling techniques. For example, a heater of a battery module may be operated to increase a temperature of the battery module to the designated range.

Alternatively, the battery module may be disconnected (decoupled) from the DC bus in step 250 and, in step 270, the battery module may be discharged to the designated SOC range (e.g., if the SOC is not already within the designated SOC range) and the OCV check may be initiated. For example, if the SOC is determined to be 95%, the battery module may be discharged to a SOC of 85% by powering its own heater and/or electronics (e.g., BMS) for a period of time (self discharge). Alternatively, the battery module may remain coupled to the DC bus and discharged by powering the auxiliary electronics of other battery modules coupled to the DC bus, for example, when the main load of the system is disconnected from the DC bus.

Referring back to step 230, if the SOC and temperature of the battery module are within their designated respective ranges then, in step 250, the battery module may be disconnected (decoupled) from the DC bus and, in step 260, the battery module is allowed to depolarize over a period of time (e.g., five minutes) after which, the OCV check is initiated.

The period of time for depolarizing allows the voltage at the terminals of the battery module 120 to drop from the DC bus potential to the OCV of the battery module. Disconnecting the battery module from the DC bus ensures that the battery module is not forced to the DC bus voltage. In accordance with an embodiment, the controller 110 commands the corresponding BMS 125 to isolate the battery module 120 from the DC bus 130.

From step 260 or step 270, the method 200 proceeds to step 280 where the system is monitored for a system discharge. A system discharge occurs when energy is being demanded from the battery modules via the DC bus (i.e., the battery modules are discharging). A system discharge may be detected by sensing a drop to a low voltage level on the DC bus. A system discharge may be an indication that the battery modules are presently being used to power the main load of the system. In accordance with an embodiment, a drop in bus voltage may be sensed by a BMS, via a sensor 126 (e.g., a voltage sensor) operatively connected between the DC bus and the BMS, and reported back to the controller by the BMS. The controller may use the reported drop in bus voltage, along with the knowledge of the number of battery modules that are connected to the DC bus (which is provided by the BMS's), to determine whether or not to cancel or defer an OCV check.

While a system discharge is not detected, the method 200 proceeds with the OCV check by measuring the OCV of the battery module and reporting the OCV value to the controller of the system in step 290. If, during the OCV check (or during the depolarization wait time), a system discharge is detected, the OCV check is terminated and the battery module is reconnected to the DC bus in step 285, assuming that the battery module is needed to power the main load of the system. Then, in step 286, the OCV check is deferred to a later time (e.g., the OCV check is re-scheduled by the controller 110).

Some of the steps of the method 200 may be performed in various orders, or at the same time, in accordance with various embodiments of the present invention, and are not limited to any strict sequence that may be suggested by FIG. 2.

In summary, the controller 110 prevents a battery module 120 from being unavailable for service (to discharge to the main load) due to an OCV check. The controller ensures that conditions of the battery module to be checked and conditions of the system are proper before performing an OCV check. Upon receiving an OCV value as a result of an OCV check for a battery module 120, the controller 110 may determine that one or more cells within the battery module have failed or are degraded, and may subsequently schedule the battery module for maintenance or replacement.

In another embodiment, a method comprises scheduling an open circuit voltage check of a battery module in a battery system. If the battery module is in operational service at a designated time of commencing the open circuit voltage check according to the scheduling, or if the battery module is scheduled to be in operational service during a duration of the open circuit voltage check according to the scheduling, the open circuit voltage check is deferred to a first time later than the designated time. Subsequent to deferring the open circuit voltage check, the method further comprises initiating the open circuit voltage check at the first time and monitoring for a battery system discharge during the open circuit voltage check. Responsive to the battery system discharge occurring during the open circuit voltage check, the method further comprises reconnecting the battery module to a DC bus of the battery system and further deferring the open circuit voltage check to a second time later than the first time.

In appended claims, the terms "including" and "having" are used as the plain language equivalents of the term "comprising"; the term "in which" is equivalent to "wherein." Moreover, in appended claims, the terms "first," "second," "third," "upper," "lower," "bottom," "top," etc. are used merely as labels, and are not intended to impose numerical or positional requirements on their objects. Further, the limitations of the appended claims are not written in means-plus-function format and are not intended to be interpreted based on 35 U.S.C. § 112, sixth paragraph, unless and until such claim limitations expressly use the phrase "means for" followed by a statement of function void of further structure. As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. Moreover, certain embodiments may be shown as having like or similar elements, however, this is merely for illustration purposes, and such embodiments need not necessarily have the same elements unless specified in the claims.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

This written description uses examples to disclose the invention, including the best mode, and also to enable one of ordinary skill in the art to practice the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differentiate from the literal language of the claims, or if they include equivalent structural elements with insubstantial differences from the literal language of the claims.

What is claimed is:

1. A method comprising:
   determining, by a controller, whether a battery module in a battery system is in operational service or if the battery module is scheduled to be in operational service during a designated period for an open circuit voltage check;
   deferring, by the controller, the open circuit voltage check of the battery module when the battery module is in operational service or when the battery module is scheduled to be in operational service during the designated period for the open circuit voltage check;
   when the battery module is not in operational service or scheduled to be in operational service during the designated period for the open circuit voltage check:
      initiating, by the controller, the open circuit voltage check,
      disconnecting the battery module from a direct current (DC) bus of the battery system, monitoring, by the controller, for an occurrence of a discharge of another battery module in the battery system connected to the direct current (DC) bus to power a main load during the open circuit voltage check, wherein the occurrence of the discharge is detected by sensing a drop in a voltage level on the DC bus; and
      reconnecting the first battery module to the direct current (DC) bus of the battery system and deferring, by the controller, the open circuit voltage check if the discharge of the another battery module occurs during the open circuit voltage check and the first battery module is needed to power the main load.

2. The method of claim 1, further comprising:
   determining if a state-of-charge of the battery module is within a designated state-of-charge range for performing the open circuit voltage check; and
   when the state-of-charge is not within the designated state-of-charge range, disconnecting the battery module from the DC bus and discharging the battery module to the designated state-of-charge range.

3. The method of claim 1, further comprising:
   determining if a state-of-charge of the battery module is within a designated state-of-charge range for performing the open circuit voltage check; and
   when the state-of-charge is within the designated state-of-charge range, disconnecting the battery module from the DC bus and waiting for the battery module to depolarize.

4. The method of claim 3, further comprising:
   measuring an open circuit voltage of the battery module; and
   reporting a value of the open circuit voltage to a controller of the battery system.

5. The method of claim 4, further comprising determining that one or more cells within the battery module have failed or are degraded, based on the reported open circuit voltage value, and scheduling the battery module for maintenance.

6. The method of claim 1, further comprising:
   determining if a state-of-charge and a temperature of the battery module are respectively within a designated state-of-charge range and a designated temperature range for performing the open circuit voltage check; and
   when the state-of-charge is not within the designated state-of-charge range and the temperature is within the designated temperature range, disconnecting the battery module from the DC bus and discharging the battery module to the designated state-of-charge range.

7. The method of claim 1, further comprising:
   determining if a state-of-charge and a temperature of the battery module are respectively within a designated state-of-charge range and a designated temperature range for performing the open circuit voltage check; and
   when the temperature is not within the designated temperature range, deferring the open circuit voltage check to a later time.

8. The method of claim 1, further comprising:
determining if a state-of-charge and a temperature of the battery module are respectively within a designated state-of-charge range and a designated temperature range for performing the open circuit voltage check; and
when the state-of-charge is within the designated state-of-charge range and when the temperature is within the designated temperature range, disconnecting the battery module from the DC bus and waiting for the battery module to depolarize.

9. The method of claim 8, further comprising:
measuring an open circuit voltage of the battery module; and
reporting a value of the open circuit voltage to a controller of the battery system.

10. The method of claim 9, further comprising determining that one or more cells within the battery module have failed or are degraded, based on the reported open circuit voltage value, and scheduling the battery module for maintenance.

11. The method of claim 1, further comprising:
measuring an open circuit voltage of the battery module; and
reporting a value of the open circuit voltage to a controller of the battery system.

12. The method of claim 11, further comprising determining that one or more cells within the battery module have failed or are degraded, based on the reported open circuit voltage value, and scheduling the battery module for maintenance.

13. A battery system comprising:
a plurality of energy storage modules operably couplable/decouplable to a direct current (DC) bus, wherein the energy storage modules include respective module management systems; and
a controller, in communication with the module management systems, that is operable to selectively initiate coupling/decoupling of the energy storage modules to the DC bus, and to:
schedule an open circuit voltage check of at least one first energy storage module of the plurality of energy storage modules,
determine if the at least one first energy storage module is to be coupled to the DC bus,
determine if a discharge associated with at least one second energy storage module connected to the DC bus to power a main load is detected during the open circuit voltage check of the at least one first energy storage module, wherein the occurrence of the discharge is detected by sensing a drop in a voltage level on the DC bus;
couple the at least one first energy storage module to the DC bus of the battery system when the discharge of the second energy storage module is detected during the open circuit voltage check and the at least one first energy storage module is needed to power the main load and defer the open circuit voltage check to a later time, and
defer the open circuit voltage check to a later time when the at least one first energy storage module is to be coupled to the DC bus.

14. The system of claim 13, wherein the controller is further operable to:

determine if a state-of-charge of the at least one first energy storage module is within a designated state-of-charge range for performing the open circuit voltage check; and
when the state-of-charge is not within the designated state-of-charge range, command that the at least one first energy storage module be decoupled from the DC bus and discharged to the designated state-of-charge range.

15. The system of claim 13, wherein the controller is operable to:
determine if a state-of-charge of the at least one first energy storage module is within a designated state-of-charge range for performing the open circuit voltage check; and
when the state-of-charge is within the designated state-of-charge range, command that the at least one first energy storage module be decoupled from the DC bus and depolarized.

16. The system of claim 15, wherein at least one of the module management systems of the at least one first energy storage module is operable to:
measure an open circuit voltage of the at least one first energy storage module; and
report a value of the open circuit voltage to the controller.

17. The system of claim 16, wherein the controller is operable to determine that one or more cells within the at least one first energy storage module have failed or are degraded, based on the reported open circuit voltage value, and schedule the at least one first energy storage module for maintenance.

18. The system of claim 13, wherein the controller is operable to:
determine if a state-of-charge and a temperature of the at least one first energy storage module are respectively within a designated state-of-charge range and a designated temperature range for performing the open circuit voltage check; and
when the state-of-charge is not within the designated state-of-charge range and the temperature is within the designated temperature range, command that the at least one first energy storage module be decoupled from the DC bus and discharged to the designated state-of-charge range.

19. The system of claim 13, wherein the controller is operable to:
determine if a state-of-charge and a temperature of the at least one first energy storage module are respectively within a designated state-of-charge range and a designated temperature range for performing the open circuit voltage check; and
when the temperature is not within the designated temperature range, defer the open circuit voltage check to a later time.

20. The system of claim 13, wherein the controller is operable to:
determine if a state-of-charge and a temperature of the at least one first energy storage module are respectively within a designated state-of-charge range and a designated temperature range for performing the open circuit voltage check; and
when the state-of-charge is within the designated state-of-charge range and when the temperature is within the designated temperature range, command that the at least one first energy storage module be decoupled from the DC bus and depolarized.

21. The system of claim 20, wherein at least one of the module management systems of the at least one first energy storage module is operable to:
  measure an open circuit voltage of the at least one first energy storage module; and
  report a value of the open circuit voltage to the controller.

22. The system of claim 21, wherein the controller is operable to determine that one or more cells within the at least one first energy storage module have failed or are degraded, based on the reported open circuit voltage value, and schedule the at least one first energy storage module for maintenance.

23. The system of claim 13, wherein at least one of the module management systems of the at least one first energy storage module is operable to:
  measure an open circuit voltage of the at least one first energy storage module; and
  report a value of the open circuit voltage to the controller.

24. The system of claim 23, wherein the controller is operable to determine that one or more cells within the at least one first energy storage module have failed or are degraded, based on the reported open circuit voltage value, and schedule the at least one first energy storage module for maintenance.

25. A battery system comprising:
  means for selectively initiating coupling/decoupling of at least one energy storage module to a direct current (DC) bus;
  means for scheduling an open circuit voltage check of the at least one energy storage module;
  means for determining if the at least one energy storage module is to be coupled to the direct current bus;
  means for determining if a discharge associated with at least one other energy storage module connected to the direct current (DC) bus to power a main load is detected during the open circuit voltage check of the at least one energy storage module, wherein the occurrence of the discharge is detected by sensing a drop in a voltage level on the DC bus;
  when the discharge of the second energy storage module is detected during the open circuit voltage check and the at least one energy storage module is needed to power the main load, means for coupling the at least one energy storage module to the direct current (DC) bus; and
  means for deferring the open circuit voltage check to a later time when the at least one energy storage module is to be coupled to the direct current bus.

26. A battery system comprising:
  coupler means for selectively initiating coupling/decoupling of at least one first energy storage module to a direct current (DC) bus;
  schedule means for scheduling an open circuit voltage check of the at least one first energy storage module;
  determination means for determining if the at least one first energy storage module is to be coupled to the direct current bus;
  the determination means comprises means for determining if a discharge associated with at least one second energy storage module connected to the direct current (DC) bus to power a main load is detected during the open circuit voltage check of the at least one first energy storage module, wherein the occurrence of the discharge is detected by sensing a drop in a voltage level on the DC bus; and
  deferral means for deferring the open circuit voltage check to a later time when the at least one first energy storage module is to be coupled to the direct current bus,
  wherein the coupler means and the deferral means comprise means for coupling the at least one first energy storage module to the direct current (DC) bus, and means for deferring the open circuit voltage check to a later time, respectively, when the discharge of the second energy storage module is detected during the open circuit voltage check and the at least one first energy storage module is needed to power the main load.

27. A method comprising:
  disconnecting a first battery module of a battery system from a direct current (DC) bus of the battery system;
  initiating, by a controller, an open circuit voltage check of the first battery module and monitoring the DC bus for a discharge of a second battery module connected to the DC bus to power a main load during the open circuit voltage check, wherein the occurrence of the discharge is detected by sensing a drop in a voltage level on the DC bus; and
  reconnecting the first battery module to the DC bus of the battery system and deferring, by the controller, the open circuit voltage check when the second battery module discharges during the open circuit voltage check and the first battery module is needed to power the main load.

28. A method comprising:
  scheduling, by a controller, an open circuit voltage check of a first battery module in a battery system;
  if the first battery module is in operational service at a designated time of commencing the open circuit voltage check according to the scheduling, or if the first the battery module is scheduled to be in operational service during a duration of the open circuit voltage check according to the scheduling, deferring, by the controller, the open circuit voltage check to a first time later than the designated time;
  subsequent to deferring the open circuit voltage check, initiating, by the controller, the open circuit voltage check at the first time and monitoring for a discharge of a second battery module connected to a direct current (DC) bus to power a main load during the open circuit voltage check, wherein the occurrence of the discharge is detected by sensing a drop in a voltage level on the DC bus; and
  responsive to the discharge occurring during the open circuit voltage check and the first battery module being needed to power the main load, reconnecting the first battery module to the DC bus of the battery system and further deferring, by the controller, the open circuit voltage check to a second time later than the first time.

* * * * *